United States Patent [19]

Schwar et al.

[11] Patent Number: 4,782,289

[45] Date of Patent: Nov. 1, 1988

[54] POSITIONING FIXTURE FOR INTEGRATED CIRCUIT CHIP TESTING BOARD

[75] Inventors: Charles H. Schwar, Irvine; John D. Platt, South Laguna, both of Calif.

[73] Assignee: Hilevel Technology, Inc., Irvine, Calif.

[21] Appl. No.: 869,131

[22] Filed: May 30, 1986

[51] Int. Cl.[4] ............................................. G01R 31/02
[52] U.S. Cl. .............................. 324/158 F; 324/73 PC
[58] Field of Search ............ 324/158 F, 73 PC, 158 P; 439/68, 78

[56] References Cited

U.S. PATENT DOCUMENTS

| | | | |
|---|---|---|---|
| 2,918,648 | 12/1959 | Ludman et al. | 324/158 P |
| 4,504,783 | 3/1985 | Zasio et al. | 324/158 F |
| 4,528,504 | 7/1985 | Thornton, Jr. et al. | 324/158 F |
| 4,644,269 | 2/1987 | Golder et al. | 324/158 F |

OTHER PUBLICATIONS

Three (3) photographs of a text fixture; Pier Electronics, Inc., Sunnyvale, CA; 1986.

Primary Examiner—Ernest F. Karlsen
Attorney, Agent, or Firm—Knobbe, Martens, Olson & Bear

[57] ABSTRACT

A fixture for clamping an integrated circuit chip testing board having a plurality of contact points to a testing platform having a plurality of corresponding protruding metal pins. The fixture includes a hinged cover with a latch for automatically aligning the testing board parallel to the testing platform and a means for automatically disabling the power supplied to the testing platform when the cover is opened and enabling the power when the cover is closed. The automatic alignment of the testing board parallel to the testing platform assures that the electrical connections between the contact points and their corresponding metal pins are substantially identical to thereby reduce testing errors caused by nonuniformity in the electrical interconnections.

12 Claims, 3 Drawing Sheets

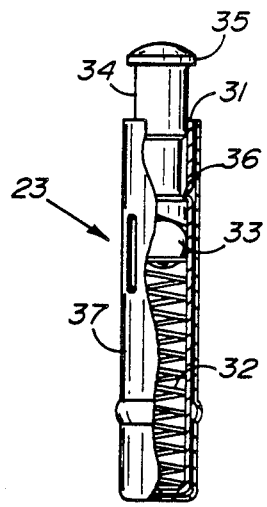
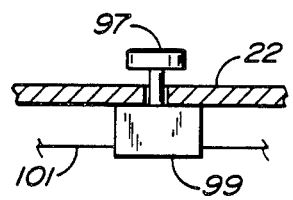
FIG. 3
FIG. 9
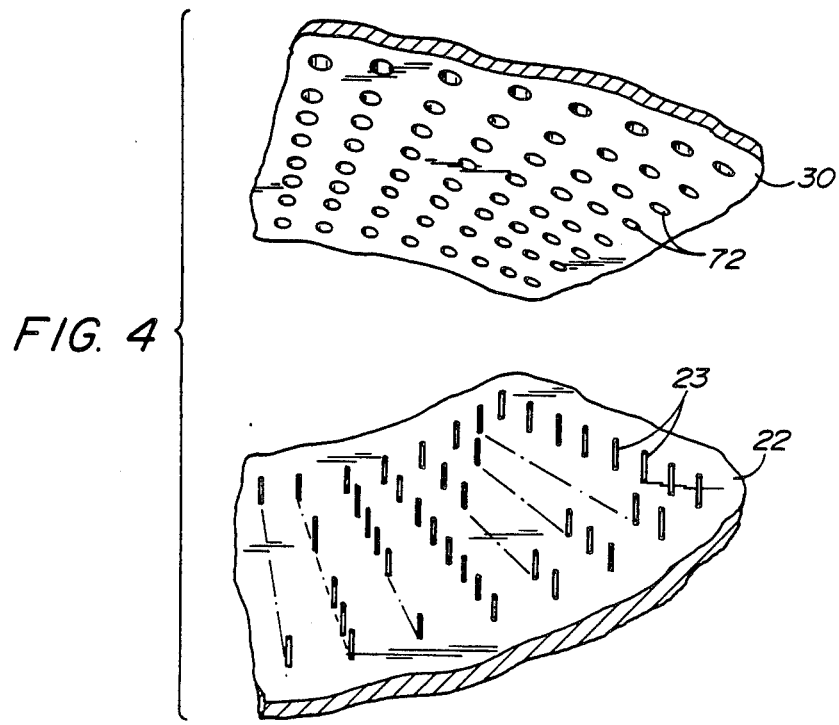
FIG. 4

POSITIONING FIXTURE FOR INTEGRATED CIRCUIT CHIP TESTING BOARD

BACKGROUND OF THE INVENTION

This invention relates to a fixture for accurately positioning and supporting an integrated circuit chip testing board during the testing of an on-board integrated circuit chip by a design verification system.

It is desirable to test very complicated integrated circuit chips during the prototype stages of development and during mass production so that the integrity of their design and manufacture may be verified. To this end complex design verification systems have been developed which selectively excite the inputs of an integrated circuit chip with many input combinations and simultaneously check the outputs for accuracy. For each input combination, there is an expected output combination. If there is a discrepancy between the expected output and the actual output for a particular input combination, there may be a design error present in the chip. By testing many input combinations, the likelihood that a fault in the chip will pass undetected is significantly reduced, if not eliminated.

Such a design verification system includes a testing unit with sophisticated electronic circuitry and software for generating the chip excitation signals and comparing the actual chip outputs with the expected outputs as well as mechanisms for electrically connecting the testing unit to the pins of the integrated circuit chip. These mechanisms typically include a testing platform attached to and electrically connected with the testing unit and a testing board, also called a device-under-test (DVT) board, removable from the testing unit to which an integrated circuit chip may be attached. The testing platform has many electrical connectors protruding from its top which are typically arranged in a plurality of concentric circles. The side of the testing board opposite to the side to which the chip is mounted has many metal pads or electrical contact points, which are also arranged on the board in concentric circles to correspond to the arrangement of electrical connectors so that when the testing board is placed onto the testing platform, each electrical connector on the platform will make contact with a respective contact point on the board. Each of the pins of the chip is electrically wired to a respective contact point on the opposite side of the board.

The electrical connectors used on the testing platform are often compressible pins. Such a pin has an internal assembly which consists of an internal casing containing a spring, a ball bearing, and a shaft connected to the head of the pin. When force is exerted on the pin head, the shaft slides further into the internal casing and compresses the spring. The distance through which the pin head may be compressed is limited by an annular stop on the inside of the internal casing.

There are typically many such pins attached to the testing platform. For example, one known design of a testing platform contains an array of up to 512 pins which are arranged in eight generally concentric circles with 64 pins in each circle.

The mechanisms for connecting the testing unit to the integrated circuit chip also include a means for clamping the testing board to the testing platform on the testing unit. A plurality of thumbscrews located about the periphery of the testing board are typically screwed through the board into a number of respective threaded bores in the testing platform to hold the testing board in place.

There are a number of problems associated with the use of thumbscrews to hold the testing board in place. First, it is desirable to depress each of the compressible pins by the same amount so that uniform electrical contact between the heads of the pins and the contact points on the testing board is achieved. However, when a plurality of thumbscrews are used to hold the board in place, there is no guarantee that each of the thumbscrews has been screwed into the testing platform to the same extent. If some screws are screwed into the testing platform more than others, the testing board will be skewed with respect to the testing platform, thus causing non-uniformities in the displacement of the compressible pin heads. This may result in non-uniformities in the electrical contact between the pins and the respective contact points, and may even result in some of the pins failing to make contact with their respective contact points, thus resulting in faulty indications of design errors when the chip is subsequently tested.

Another problem stemming from the use of thumbscrews to hold the testing board in place lies in the possibility that one of the metal thumbscrews may be inadvertently dropped onto the testing board after it is placed onto the compressible pins. If the testing unit power is on, the dropped thumbscrew might provide a conducting bridge between some of the metallized circuits on the testing board and cause a short circuit, possibly damaging the testing unit and/or the prototype integrated circuit chip.

SUMMARY OF THE INVENTION

The present invention solves these and other problems by providing a frame with a hinge for clamping the testing board to the testing platform to electrically connect the array of contact points on the testing board to the array of electrical connectors so that the electrical coupling between each of the contact points and each of the electrical connectors is substantially identical. This substantially identical electrical coupling is accomplished in part by the use of a latch in connection with the hinged frame so that the frame holds the testing board in a clamped position which is substantially parallel to the testing platform.

Another feature of the invention includes means for automatically disabling the power supplied to the testing board when the hinged frame is opened and enabling the power to the testing board when the frame is closed.

These and other objects, features, and advantages of the present invention will be apparent to those of ordinary skill in the art in view of the detailed description of the preferred embodiment, which is made with reference to the drawings described below.

BRIEF DESCRIPTION OF THE DRAWINGS

FIG. 3 is an elevational view of a compressible pin used in the preferred embodiment with portions of the pin removed to show its internal construction;

FIG. 4 is a perspective view of portions of the testing board of FIG. 2B and the testing platform of the preferred embodiment, showing the patterns of the connector pins of the testing platform and the contact points of the testing board in greater detail;

FIG. 9 is a view showing the location of a conventional momentary contact switch in the design verification system.

DETAILED DESCRIPTION OF THE PREFERRED EMBODIMENT

Figure 1:
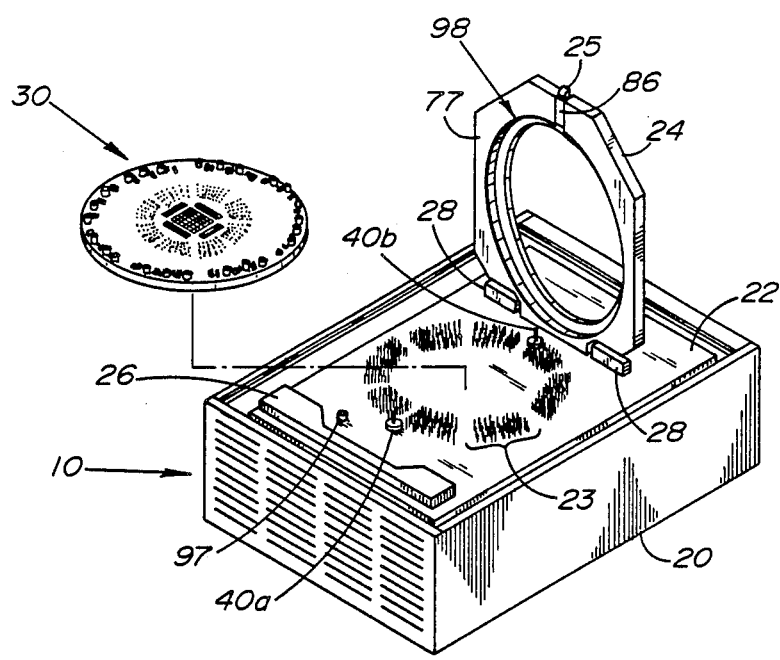
FIG. 1 is a perspective view of an integrated circuit design verification system incorporating the preferred embodiment of the invention.

Illustrated in FIG. 1 is a design verification system 10 for very large scale integrated (VLSI) circuits incorporating the preferred embodiment of the present invention. The design verification system 10 includes a testing unit 20 which contains the electronic circuitry and software used to accomplish the testing of VLSI chips. The testing unit 20 is attachable to a conventional computer (not shown) to facilitate such testing.

The preferred embodiment of the present invention includes a flat metal testing platform 22 attached to the testing unit 20. The testing platform 22 has an array of fixably attached compressible metal pins 23 which are arranged in eight substantially concentric circles. Each of the concentric circles contains 64 compressible pins which are grouped in groups of eight for a total of 512 pins. Each of the pins 23 is attached through a respective bore in the testing platform 22 and soldered thereto on the underside of the platform to provide electrical interconnection of the pins 23 to printed circuit lines on the testing platform 22.

Also attached to the testing platform 22 are a hinged frame 24 with a latch 25 and a clamp plate 26. The frame 24 is mounted to the platform 22 by a pair of hinge blocks 28. The frame 24 is used to hold a conventional circular testing board 30, called a device-under-test (DVT) board, in contact with the pins 23 on the platform 22.

FIG. 3 illustrates the type of compressible pin 23 used in the preferred embodiment. The pin 23 has an internal assembly which consists of a generally cylindrical, hollow internal casing 31 with an opening at its upper end. The internal casing 31 houses a spring 32, a ball bearing 33, and a cylindrical shaft 34 connected to the pin head 35. When force is exerted on the pin head 35, the shaft 34 slides further into the internal casing 31 and compresses the spring 32. The distance through which the pin 23 may be compressed is limited by the cooperation of an annular stop 36 and a portion of the shaft 34 having a reduced diameter. The annular stop 36 protrudes from the inside of the internal casing 31 to limit the travel of the pin shaft 34 to a distance equal to the length of the shaft portion having the reduced diameter.

The internal casing 31 is enclosed by and removable from an outer cylindrical casing 37 which is soldered to the underside of the testing platform 22. When one of the pins 23 becomes inoperative, the inoperative internal assembly may be removed from its outer casing 37 and a new internal assembly may be inserted in its place. Thus, the pins 23 on the testing platform 22 may be effectively replaced without the need for resoldering them. Since there is always a possibility of damaging the circuit lines on the testing platform when unsoldering pins, the use of the replaceable internal assemblies reduces the possibility of damage. An exemplary pin such as is illustrated in FIG. 3, is a contact pin available from Pylon Company, Inc. of North Attleboro, Mass. and sold under the registered trademark POGO ®.

As shown in FIG. 1, two diametrically opposed guide rods 40a and 40b are attached to the testing platform 22 just outside the concentric circles of pins 23. Each of the guide rods 40a and 40b is cylindrical in shape with a diameter of approximately one-eighth of an inch and a height of approximately one-half of an inch. The testing board 30 has a pair of circular, diametrically opposed guide holes 50a and 50b (FIG. 2A) through which the guide rods 40a and 40b pass, respectively, when the board 30 is properly aligned with the testing platform. The guide rods 40a and 40b and guide holes 50a and 50b cooperate so that the testing board 30 is properly aligned over the pins 23 on the testing platform 22. In an alternative embodiment (not shown), the guide rods 40a and 40b and the guide holes 50a and 50b are asymmetrically positioned on the testing platform 22 and the testing board 30 so that the testing board 30 can only be positioned on the testing platform 22 in one specific orientation and may not be rotated by 180 degrees. The asymmetry may advantageously be accomplished by adding a third guide pin (not shown) and a third guide hole (not shown) to the guide pins 40a and 40b and the guide holes 50a and 50b shown in FIGS. 1 and 2A, respectively.

Figure 2A:
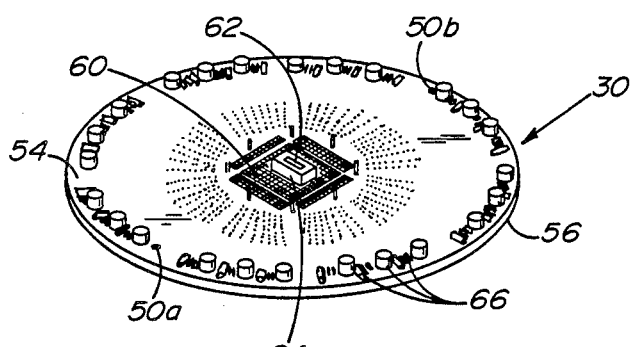
FIG. 2A is a perspective view of the side of an integrated circuit chip testing board to which an integrated circuit chip is attached.

The testing board 30 has a top surface 54 and a bottom surface 56. FIG. 2A shows the top surface 54 of the testing board 30 which faces up when the board is placed in the design verification system 10. The top surface 54 of the board 30 includes a square matrix 60 of holes extending through the board 30 which accept the pins of a removably attached integrated circuit chip 62 through a conventional connector 64. Alternatively, the pins of the chip 62 may be directly coupled to the square matrix of holes without the use of the connector 64. Also included on the top surface 54 of the board 30 are a plurality of passive elements 66, such as inductors, resistors and capacitors, used for impedance matching purposes.

Figure 2B:
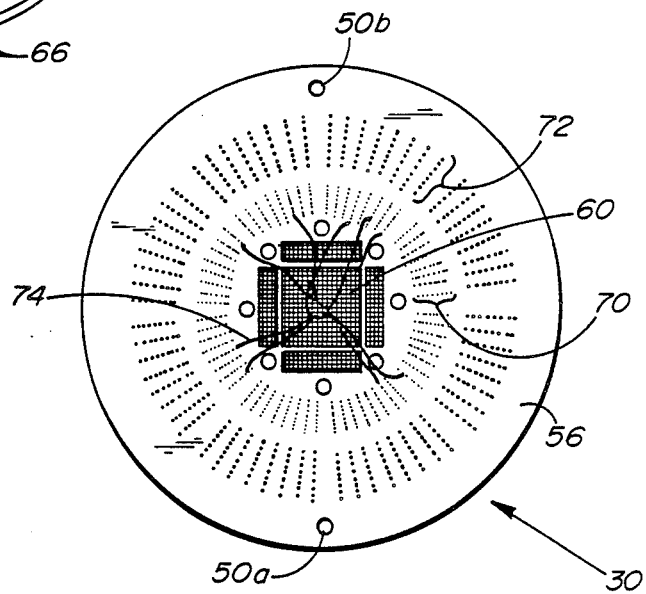
FIG. 2B is a view of the reverse side of the testing board illustrated in FIG. 2A.

The bottom surface 56 of the testing board 30, which is shown in FIG. 2B, includes the square matrix 60 of holes at its center, an inner array of connection points 70, and an outer array of metal pads, or contact points 72, each of which is approximately one-eighth of an inch in diameter. Both the inner and outer arrays of points 70, 72 are arranged in substantially concentric circles. A plurality of wires 74 connect the pins of the integrated circuit chip to be tested via the square matrix 60 of holes to the inner array of connection points 70. Each of the connection points 70 in the inner array is electrically connected to a respective contact point 72 in the outer array via a conventional metallization path (not shown) on the board 30. The total effect of these interconnections is that each pin on the integrated circuit chip 62 on the top side of the board 30 is electrically connected to a single respective contact point 72 in the outer array on the underside of the board 30. While a relatively simple integrated circuit chip 62 is shown, a much larger, more complex integrated circuit chip with many pins may be tested by adding appropriate interconnections from the square matrix 60 to the inner array of connection points 70. Thus, the interconnections of the wires 74 may be changed to accommodate the testing of a variety of integrated circuit chips.

The contact points 72 on the underside of the board 30 are arranged to form an array identical to that formed by the compressible pins 23 on the testing platform 22. FIG. 4 shows a portion of the underside of the testing board 30 as well as a respective portion of the pins 23 protruding from the testing platform 22. Each of the pins 23 and contact points 72 is precisely aligned so that when the testing board 30 is properly aligned via the guide rods 40a and 40b and the guide holes 50a and 50b and placed over the pins 23 on the testing unit 22, each of the contact points 72 on the underside of the board 30 will be electrically connected to a single, respective compressible pin 23 on the testing platform 22. Each of the compressible pins 23 is connected to a respective pin of a conventional connector (not shown) on the underside of the testing platform 22 by a respective metallization path (not shown) on the underside of the testing platform 22. Each of the metallization paths has a substantially identical length so that the time delay of the electrical signal from each of the pins 23 to is respective connector pin is approximately equal, which is important for timing purposes. The electronics of the testing unit 20 are electrically connected to the pins 23 via these connectors. Thus, the testing unit 20 may supply the necessary input excitations and sample the actual outputs of an integrated circuit chip by selectively applying signals to and receiving signals from the pins 23 on the testing platform 22.

Figure 5:
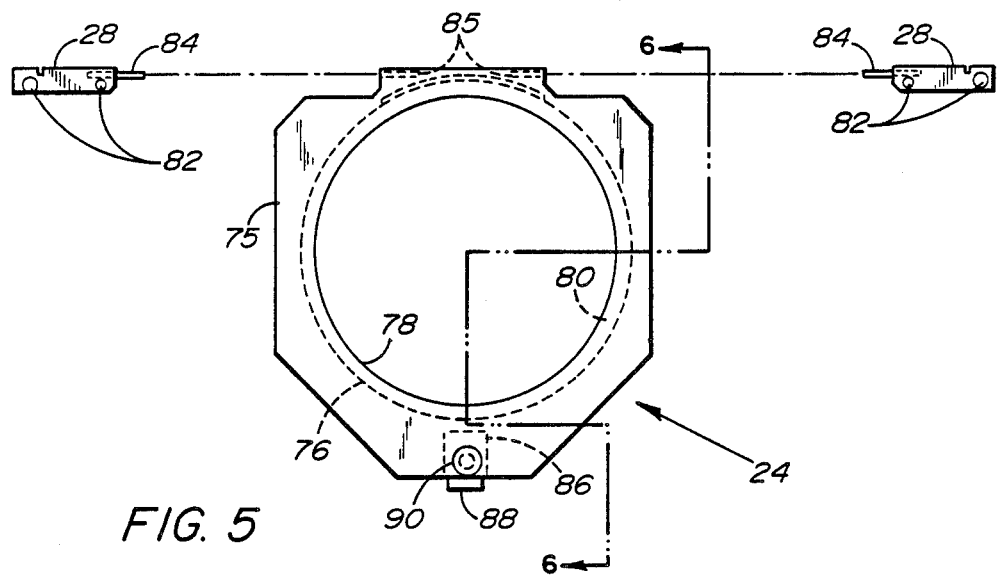
FIG. 5 is a top view of a hinged frame with hinge blocks used in the preferred embodiment.
Figure 6:
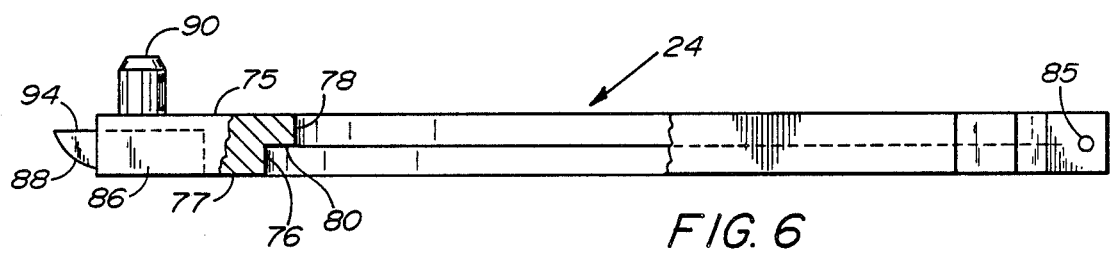
FIG. 6 is a side elevational view, in partial cross-section, of the hinged frame shown in FIG. 5.
Figure 7:
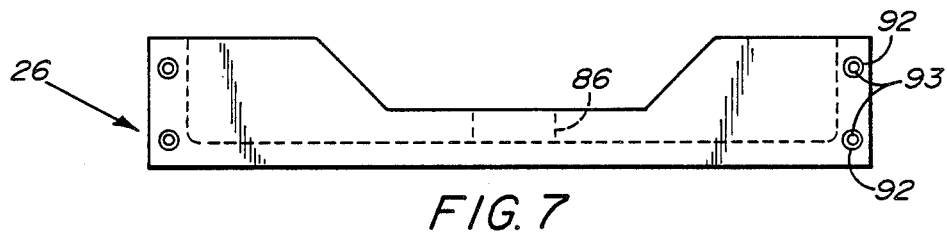
FIG. 7 is a top view of a clamp plate of the preferred embodiment.
Figure 8:
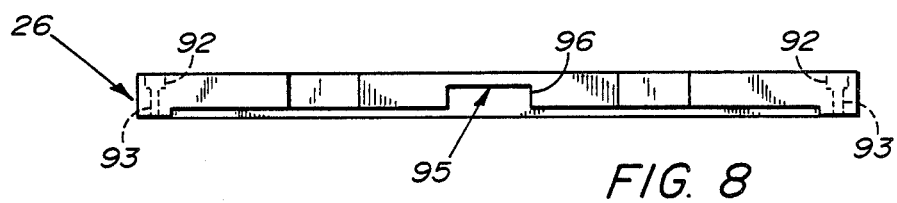
FIG. 8 is a side elevational view of the clamp plate of FIG. 7.

The hinged frame 24 and its hinge blocks 28 are shown in more detail in FIGS. 5 and 6. The frame 24, which is formed of aluminum alloy or the like, has a top surface 75 and a bottom surface 77. The frame 24 has an outer circular aperture 76 formed in the bottom surface 77 that has a diameter larger than the diameter of the circular testing board 20 so that the circular testing board fits in the outer aperture 76. The frame 24 has an inner circular aperture 78 formed in the top surface 75 that is concentric with the outer circular aperture 76. The diameter of the inner circular aperture 78 is smaller than the diameter of the outer circular aperture 76 and is also smaller than the diameter of the circular testing board 30. The two circular apertures 78, 76 meet at the approximate middle of the height of the frame 24 to form an overhanging annular lip 80. In operation, the testing board 30 is positioned so that the guide holes 50a and 50b receive the guide rods 40a and 40b. The frame 24 is then lowered over the testing board 30 so that the outer circular aperture 76 surrounds the testing board 30. Since the diameter of the inner aperture 78 is smaller than the diameter of the testing board 30, the annular lip 80 forces the board 30 against the compressible pins 23, thereby compressing them, when the frame 24 is closed and latched.

As set forth above, the frame 24 is connected to the testing platform 22 by the pair of hinge blocks 28. Each of the hinge blocks 28 has a pair of bores 82 for accepting a pair of bolts (not shown) for bolting the blocks 28 to the platform 22. Each of the blocks 28 also incorporates a cylindrical rod 84 which is inserted into a respective circular bore 85 on either side of the frame 24 so that the frame 24 is hingedly attached to the hinge blocks 28 and rotatable about the two cylindrical rods 84.

The frame 24 also incorporates a conventional latch assembly 86 with a latch 88 and a knob 90 for retracting the latch 88 into the latch assembly 86. The latch assembly 86 and the latch 88 cooperate with the clamp plate 26, shown in detail in FIGS. 5 and 6, to hold the frame in a closed, clamped position. The clamp 26 is fixed to the testing platform 22 by four countersunk bores, each with an upper bore 92 of a larger diameter and an aligned lower bore 93 with a smaller diameter for accepting four bolts (not shown).

The latch has a top surface 94. When the frame 24 is closed, the top surface 94 of the latch 88 is held in place by an upper surface 95 of an opening 96 in the clamp plate 26. The frame 24 is opened by rotating the knob 90 to retract the latch 88 into the latch assembly 86.

The height of the upper surface 95 on the clamp plate 26 with respect to the top of the testing plate 22 is selected so that when the testing board 30 is clamped into place between the frame 24 and the array of pins 23, the board 30 will lie substantially parallel to and above the surface of the testing platform 22. Each of the pins 23 in the array on the platform 22 will be compressed a substantially equal amount (e.g., approximately 60% of its compressible distance) so that the electrical coupling between each of the contact points 72 on the underside of the testing board 30 and each of the pins 23 on the testing platform 22 will be substantially identical.

One skilled in the art will understand that the testing board 30 is provided with power from one or more dc power supplies through one or more of the pins 23 on the testing platform 22 and corresponding connection points 72 on the testing board 30. It is possible under some circumstances to damage the testing board 30 or the integrated circuit chip 62 (i.e., the device under test) by applying dc power to the wrong connection points 72 while the testing board 30 is being positioned on the testing platform 22. In order to substantially eliminate this possible source of damage, the preferred embodiment of the present invention includes a switch 99 shown in FIG. 9 as attached to the underside of the testing platform 22, to selectively enable and disable the dc power provided to the testing board 30 via an electrical line 101. The switch 99, which is advantageously a spring-biased, momentary contact on-off switch, is located below the testing platform 22. The preferred embodiment also includes a cylindrical switch actuator 97 (FIG. 1) attached to the testing platform 22 that is linked to the switch 99. A cylindrical member 98 is attached to the hinged frame 24 and is positioned so that when the frame 24 is closed, the cylindrical member 98 contacts and moves the switch actuator 97. The switch actuator 97 engages the switch 99 so that the switch 99 enables the dc electrical power supplied to the pins 23 and thus to the testing board 30. When the frame 24 is opened, the actuator 97 disengages the switch 99 to disable the dc power supplied to the testing board 30. This automatic disabling of power upon the opening of the frame 24 helps to prevent short circuits which might cause damage to the integrated circuit chip being tested or to the testing unit 20, since the frame 24 cannot be closed until the testing board 30 is properly aligned with respect to the guide rods 40a and 40b. When aligned in this manner, each of the electrical connectors 23 is properly aligned with its respective contact point 72. Thus, since power is not applied to the pins 23 until the testing board 30 is properly aligned, short circuits due to the misalignment of the board 30 are prevented.

While the frame 24 of the preferred embodiment has round apertures 76, 78, the benefit of the invention would still be obtained if apertures of other shapes were utilized. In addition, while the means for aligning the testing board 30 with respect to the testing platform 22 is shown to be the guide rods 40a and 40b attached to the testing platform 22 and the guide holes 50a and 50b formed in the testing board 30, different alignment means may be used while still obtaining the benefits of the invention. For example, a frame having asymmetrical trapezoidal apertures might be used in conjunction with a testing board having the same shape as the apertures.

Further modifications and alternative embodiments of the invention will be apparent to those skilled in the art in view of the foregoing description. Accordingly, this description is to be construed as illustrative only and is for the purposes of teaching those skilled in the art the best mode of carrying out the invention. The details of the structure may be varied substantially without departing from the spirit of the invention, and the exclusive use of all modifications which come within the scope of the appended claims is reserved.

What is claimed is:

1. An apparatus for accurately positioning an integrated circuit chip testing board in a design verification system for testing integrated circuits to ensure uniform electrical connection of the testing board and minimization of the application of erroneous signals to the testing board, the testing board having a central matrix of points at which the pins of an integrated circuit chip may be electrically coupled and an outer array of contact points electrically connectable to the central matrix, said apparatus comprising:
   a testing platform with an array of electrical connectors protruding from the surface of said platform;
   means for aligning the outer array of contact points on the testing board with said array of electrical connectors on said testing platform;
   a hinged frame attached to said testing platform for clamping the testing board on said testing platform to electrically connect said contact points and said connectors so that the electrical coupling between each of the contact points and each of said electrical connectors is substantially identical, said hinged frame having a circumferential lip which directly abuts the testing board and holds it in place on said testing platform; and
   a latch mounted on said testing platform and engageable with said hinged frame to hold said hinged frame substantially parallel with said testing platform to ensure uniform contact of said electrical connectors with said testing board.

2. The apparatus as defined in claim 1 additionally comprising means for automatically disabling the power supplied to at least one of said electrical connectors upon the opening of said frame and enabling the power upon the closing of said frame.

3. The apparatus as defined in claim 1 wherein said electrical connectors are compressible pins.

4. The apparatus as defined in claim 3 wherein each of said compressible pins has an internal assembly and an outer casing which is fixably attached to said testing platform whereby a new internal assembly may be inserted into said outer casing upon the original internal assembly becoming inoperative.

5. The apparatus as defined in claim 1 wherein said array of electrical connectors comprises a plurality of rows of electrical connectors arranged to form a plurality of substantially concentric circles.

6. The apparatus as defined in claim 1 wherein said frame is formed of an aluminum alloy.

7. The apparatus as defined in claim 1 additionally comprising:
   means for automatically disabling the power supplied to at least one of said electrical connectors upon the opening of said frame and enabling the power upon the closing of said frame.

8. An apparatus for accurately positioning an electronic device testing board with respect to a testing platform with an array of protruding electrical connectors, comprising:
   means for aligning an electronic device testing board with respect to the testing platform;
   a hinged frame attached to the testing platform for clamping the testing board to electrically connect the testing board to the electrical connectors on the testing platform to an extent which is substantially the same across the testing platform, said hinged frame having a circumferential lip that directly abuts the testing board and holds it in place on the testing platform; and
   a latch mounted on said testing platform and engageable with said hinged frame to hold said testing board substantially parallel with said testing platform, and thereby assure substantially uniform contact between said protruding electrical connectors and said testing board.

9. The apparatus as defined in claim 8 additionally comprising means for automatically disabling the power supplied to the testing platform upon the opening of said frame and enabling the power upon the closing of said frame.

10. The apparatus as defined in claim 8 wherein said electrical connectors are compressible pins.

11. The apparatus as defined in claim 10 wherein each of said compressible pins has an internal assembly and an outer casing fixably attached to the testing platform whereby a new internal assembly may be inserted into said outer casing upon the original internal assembly becoming inoperative.

12. The apparatus as defined in claim 8 additionally comprising:
   means for automatically disabling the power supplied to the testing platform upon the opening of said frame and enabling the power upon the closing of said frame.

* * * * *